United States Patent
Cap et al.

(10) Patent No.: US 12,543,291 B2
(45) Date of Patent: *Feb. 3, 2026

(54) CORROSION PREVENTIVE HEATSINK FOR NETWORK DEVICE

(71) Applicant: Cisco Technology, Inc., San Jose, CA (US)

(72) Inventors: Mehmet Onder Cap, Sunnyvale, CA (US); Manigandan Boopalan, Bangalore (IN); Joel Richard Goergen, Soulsbyville, CA (US); Sandeep Mehdiratta, Rajouri Garden (IN); Manjunatha Reddy Shivashankara, Bagepalli (IN); Damaruganath Pinjala, Bangalore (IN)

(73) Assignee: CISCO TECHNOLOGY, INC., San Jose, CA (US)

( * ) Notice: Subject to any disclaimer, the term of this patent is extended or adjusted under 35 U.S.C. 154(b) by 50 days.

This patent is subject to a terminal disclaimer.

(21) Appl. No.: 18/596,926

(22) Filed: Mar. 6, 2024

(65) Prior Publication Data

US 2024/0215196 A1 Jun. 27, 2024

Related U.S. Application Data

(63) Continuation of application No. 17/528,379, filed on Nov. 17, 2021, now Pat. No. 11,980,005, which is a
(Continued)

(51) Int. Cl.
*H05K 7/20* (2006.01)
*H05K 1/02* (2006.01)

(52) U.S. Cl.
CPC ....... *H05K 7/20154* (2013.01); *H05K 1/0203* (2013.01); *H05K 2201/066* (2013.01)

(58) Field of Classification Search
None
See application file for complete search history.

(56) References Cited

U.S. PATENT DOCUMENTS

| 4,763,225 A | 8/1988 | Frenkel et al. |
| 5,742,478 A | 4/1998 | Wu |

(Continued)

FOREIGN PATENT DOCUMENTS

| WO | 2013117220 A1 | 8/2013 |
| WO | 2019087743 A1 | 5/2019 |

OTHER PUBLICATIONS

Cisco: "Cisco IR829 Industrial Integrated Services Routers Data Sheet," Dec. 2, 2020, 41 Pages, Retrieved from URL: https://www.cisco.com/c/en/US/products/collateral/routers/829-industrial-router/datasheet-c78-734981.html.

(Continued)

*Primary Examiner* — Courtney L Smith

(57) ABSTRACT

In one embodiment, an apparatus includes a chassis base, a printed circuit board mounted on the chassis base, a heatsink positioned over the printed circuit board to prevent corrosion of components on the printed circuit board, wherein the heatsink comprises a plurality of upward extending fins and a plurality of downward extending walls, a seal interposed between an edge of the downward extending walls and the chassis base, and a cover extending over the heatsink.

20 Claims, 9 Drawing Sheets

Related U.S. Application Data continuation of application No. 16/842,505, filed on Apr. 7, 2020, now Pat. No. 11,234,342.

(60) Provisional application No. 62/915,341, filed on Oct. 15, 2019.

(56) References Cited

U.S. PATENT DOCUMENTS

| | | | |
|---|---|---|---|
| 6,144,556 A | 11/2000 | Lanclos | |
| 6,411,514 B1 | 6/2002 | Hussaini | |
| 6,864,573 B2 * | 3/2005 | Robertson | H05K 7/20409 |
| | | | 361/801 |
| 7,082,033 B1 | 7/2006 | Akram | |
| 8,542,512 B2 | 9/2013 | Garrity | |
| 8,681,501 B2 * | 3/2014 | Govindasamy | G06F 1/203 |
| | | | 174/16.3 |
| 9,545,032 B2 | 1/2017 | Baer et al. | |
| 9,681,565 B2 * | 6/2017 | Escamilla | H05K 3/284 |
| 10,073,230 B2 | 9/2018 | Wilcox et al. | |
| 10,383,253 B1 * | 8/2019 | Mujcinovic | H05K 7/20409 |
| 10,575,433 B2 | 2/2020 | Flavin et al. | |
| 10,595,393 B2 | 3/2020 | Sato et al. | |
| 11,980,005 B2 * | 5/2024 | Cap | H05K 7/20154 |
| 2005/0088826 A1 * | 4/2005 | Throum | H05K 5/0052 |
| | | | 361/719 |
| 2006/0082973 A1 | 4/2006 | Egbert et al. | |
| 2006/0176666 A1 | 8/2006 | Saturley et al. | |
| 2007/0134981 A1 | 6/2007 | Shinoda et al. | |
| 2011/0222244 A1 | 9/2011 | Takashiro et al. | |
| 2015/0086164 A1 | 3/2015 | Nishimura et al. | |
| 2016/0044825 A1 * | 2/2016 | Baer | H05K 5/0217 |
| | | | 165/80.2 |
| 2017/0059797 A1 | 3/2017 | Tanabe et al. | |
| 2017/0290209 A1 * | 10/2017 | Craig | H01L 23/42 |
| 2017/0301375 A1 * | 10/2017 | Mayhall | G11B 33/124 |
| 2018/0332734 A1 * | 11/2018 | Bandorawalla | H01L 21/4882 |
| 2019/0364696 A1 | 11/2019 | Mujcinovic | |
| 2020/0008292 A1 * | 1/2020 | Sato | H03F 3/187 |

OTHER PUBLICATIONS

Keller J., "3U VXP- or CompactPCI-Based Rugged Computer for Avionics and Vetronics Introduced by Aitech," Mar. 22, 2012, 2 Pages, Retrieved from URL: https://www.militaryaerospace.com/computers/article/16719504/3u-vpx-or-compactpcibased-rugged-computer-for-avionics-and-vetronics-introduced-by-aitech.

Nampoothiri S., et al., "Implementation of Peltier Cooling in Hermetically Sealed Electronic Packaging Unit for Sub-Sea Vessel," Defence Science Journal, May 2018, vol. 68, No. 3, pp. 326-332.

* cited by examiner

CORROSION PREVENTIVE HEATSINK FOR NETWORK DEVICE

STATEMENT OF RELATED APPLICATIONS

The present application is a continuation of U.S. application Ser. No. 17/528,379, entitled, "CORROSION PREVENTIVE HEATSINK FOR NETWORK DEVICE," filed Nov. 17, 2021, now U.S. Pat. No. 11,980,005, which is a continuation of U.S. application Ser. No. 16/842,505, entitled "CORROSION PREVENTIVE HEATSINK FOR NETWORK DEVICE," filed Apr. 7, 2020, now U.S. Pat. No. 11,234,342, which claims priority to and the benefit of U.S. Provisional Application No. 62/915,341, entitled "CORROSION PREVENTIVE CHASSIS FOR HARSH ENVIRONMENT DEPLOYMENT," filed on Oct. 15, 2019, each of which is hereby incorporated in its entirety for all purposes.

TECHNICAL FIELD

The present disclosure relates generally to network devices in a communications network, and more particularly, to corrosion protection for network devices.

BACKGROUND

Network communications systems utilize network devices that include complex and sensitive electronic components. The network devices are typically designed to operate in a controlled environment such as data centers and central offices with controlled temperature, humidity, and air quality. However, when deployed in harsh environments where there is no control of surrounding air temperature, humidity, and quality, forced cooled rack mounted equipment may exhibit corrosion induced failures, which results in service interruption.

BRIEF DESCRIPTION OF THE FIGURES

Corresponding reference characters indicate corresponding parts throughout the several views of the drawings.

DESCRIPTION OF EXAMPLE EMBODIMENTS

Overview

Figure 1:
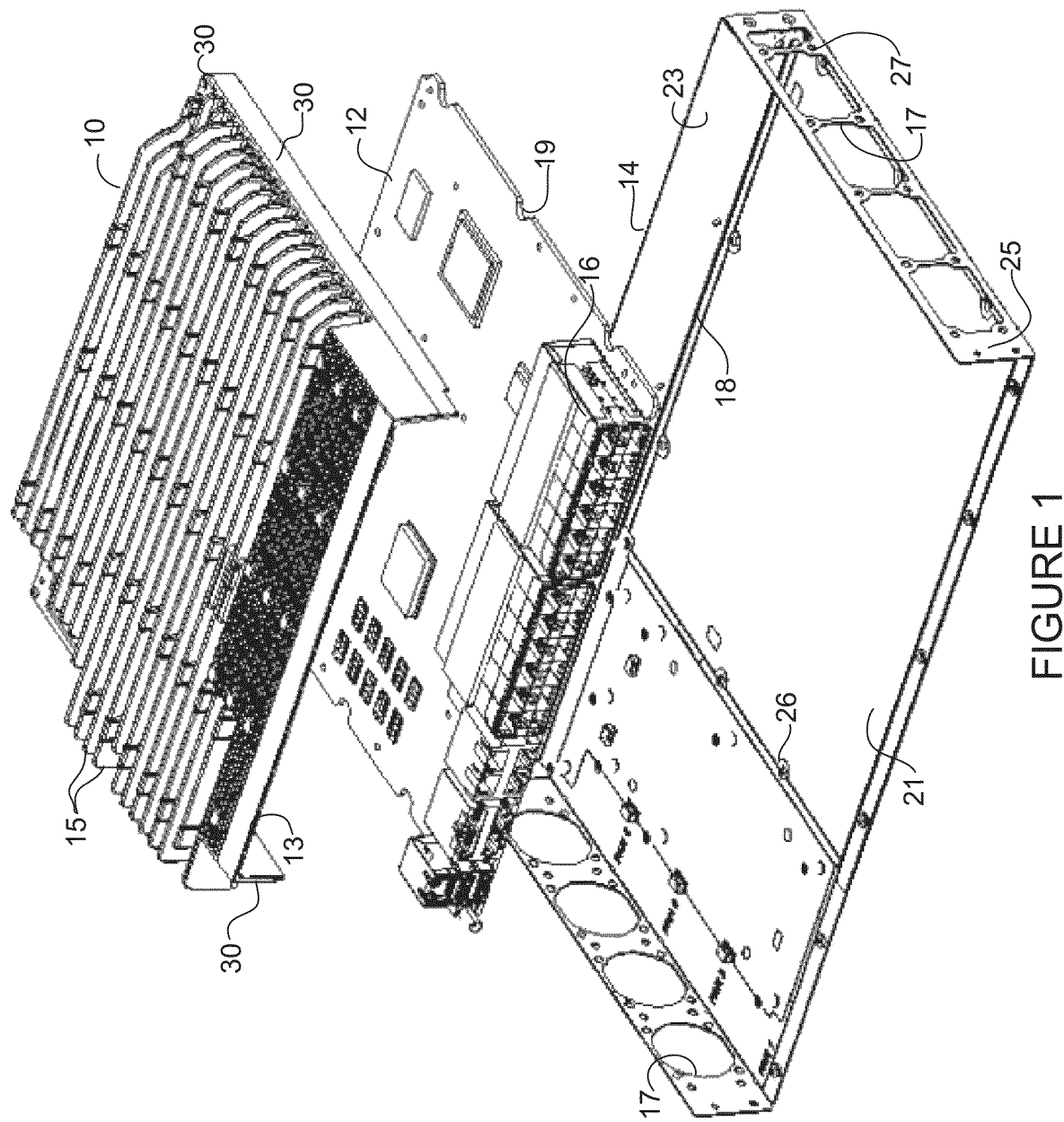
FIG. 1 is an exploded perspective of a corrosion preventive heatsink, printed circuit board, and chassis base, in accordance with one embodiment.

In one embodiment, an apparatus generally comprises a chassis base, a printed circuit board mounted on the chassis base, a heatsink positioned over the printed circuit board to prevent corrosion of components on the printed circuit board, wherein the heatsink comprises a plurality of upward extending fins and a plurality of downward extending walls, a seal interposed between an edge of the downward extending walls and the chassis base, and a chassis cover extending over the heatsink.

In one or more embodiments, the apparatus further comprises a fan positioned on the chassis base for generating airflow across the fins of the heatsink.

In one or more embodiments, the heatsink and chassis base define sealed cavities above the printed circuit board and below the printed circuit board.

In one or more embodiments, an inner edge of the heatsink defines a shoulder engaged with an upper side of the printed circuit board.

In one or more embodiments, the apparatus further comprises a thermal pad interposed between an internal surface of the heatsink and a chip mounted on the printed circuit board.

In one or more embodiments, the heatsink generally extends along an entire width of the chassis base.

In one or more embodiments, the seal comprises a U-shaped gasket comprising one or more sealing elements.

In one or more embodiments, a front edge of the heatsink is in direct contact with an optical module port.

In another embodiment, an apparatus generally comprises a chassis base, a printed circuit board mounted on the chassis base, a plurality of fans mounted on the chassis base, and a heatsink positioned over the printed circuit board to prevent corrosion of the printed circuit board. The heatsink comprises a plurality of fins positioned to allow airflow generated by the fans to flow across the fins.

In yet another embodiment, an apparatus generally comprises a chassis base, a printed circuit board mounted on the chassis base, and a heatsink positioned over the printed circuit board. The heatsink comprises a rear wall and side walls for creating a seal with the chassis base and a front opening for receiving an optical module cage mounted on the printed circuit board to protect the printed circuit board from corrosion and provide cooling to the printed circuit board and an optical module inserted into the optical module cage.

Further understanding of the features and advantages of the embodiments described herein may be realized by reference to the remaining portions of the specification and the attached drawings.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network communications devices are increasingly being used in uncontrolled or partially uncontrolled environments that have different conditions than a data center or central office. In many of these deployments, the network device has no environmental protection (or only partial protection) and may be directly exposed to ambient air. Based on the climatic conditions of the area, the ambient air may not only carry a lot of dust and moisture, but also different chemical compounds. The network device may be subjected to adverse environmental factors including temperature and humidity extremes, airborne particulates, chemical pollutants, and other contaminants. The environment in which the network device operates may not be conducive to prolonged operation and life of the equipment. For example, when deployed in harsh environments (e.g., no air conditioning or filter cabinets) with high humidity, hygroscopic dust, and salt fog, rack mountable equipment may severely suffer from corrosion related failures.

Although all types of outdoor equipment face these issues, the severity of the failure is typically higher for forced air cooled devices due to the high flow rate of contaminated air within equipment enclosures. In a forced air cooled network device, the contaminants in the air may react with metal used in electronic components and cause corrosion. Deployment of network devices in the presence of uncontrolled contamination in cooling air (e.g., dust, moisture, abrasive chemicals, water soluble salts, etc.), may lead to damage of the components. Failure of the network device or components may occur very quickly in an uncontrolled environment. These failures are not predictable and therefore create service interruption and high costs for replacement units. Since these failures are often not recoverable, the downtime associated with these failures may be significant.

One method for protecting components from corrosion is a conformal coating process that coats a printed circuit board assembly with a thin film for protection of surface mounted components from corrosion. However, conformal coatings may not reduce corrosion to a desired level. For example, hygroscopic dust and salt fog combined with high air velocity from cooling fans may erode the conformal coating and allow corrosion to start. Moreover, when the conformal coating is applied, reworking of components becomes difficult and units may need to be replaced, rather than repaired.

In harsh environments such as cell towers with high humidity, hygroscopic dust, salt fog, and high velocity air, the only way to protect a printed circuit board assembly from corrosion is to isolate it from the corrosive environment. As the conventional method of conformal coating does not work well, it is important to provide isolation without jeopardizing thermal performance, The embodiments described herein provide a corrosion preventive heatsink that eliminates (or reduces) a need for a conformal coating, thus allowing printed circuit boards to be easily reworked. Furthermore, as described in detail below, the heatsink is configured to operate in a fan assisted environment, thus providing additional cooling. Since the heatsink allows for a reduction in the air passing through the chassis, corrosion on non-sealed parts of the chassis due to contaminants, hygroscopic dust, high humidity, and possible high salt in the humid air in coastal regions is also reduced.

Referring now to the drawings, and first to FIG. 1, a large heatsink (sealing heatsink, corrosion preventive heatsink) 10 configured to seal a printed circuit board (PCB) (also referred to herein as a PCBA) 12 including both component (upper side of PCB as viewed in FIG. 1) and solder (lower side of PCB) is shown. As described in detail below, the heatsink 10 engages with a chassis base 14 and a port assembly (optical module ports, optical module cages, cage assembly, Ethernet ports) 16 to cover, seal, and protect the entire PCB 12, thereby eliminating (or reducing) the need to apply conformal coatings to the PCB.

The heatsink 10 is positioned over the printed circuit board 12 to prevent corrosion of the printed circuit board (i.e., printed circuit board and components mounted on the printed circuit board). As shown in the example of FIG. 1, the heatsink 10 comprises a plurality of upward extending fins 15 and a plurality of downward extending walls (rear wall and side walls) 30. A seal 18 is interposed between a periphery edge of the downward extending walls 30 and the chassis base 14. As described below with respect to FIG. 6, a cover extends over the heatsink 10. The heatsink 10 generally extends the entire width of the chassis base 14 (from front to rear as viewed in FIG. 1).

As shown in FIG. 1, a natural convection cooling style heatsink 10 is positioned to mate with the chassis base 14 and cover the entire PCB (PCBA) 12. As described below, a front portion (as viewed in FIG. 1) of the heatsink 10 mates with one or more port assemblies 16 positioned on a front edge of the printed circuit board 12 for receiving optical modules (transceiver modules) or plugs. One or more seals (sealing gasket) 18 positioned on the base 14 of the chassis allow the heatsink 10 to create sealed cavities above and below the PCB 12, as described below with respect to FIGS. 4 and 5.

The heatsink 10 includes a plurality of fins 15, which allows excess thermal energy to dissipate into the environment by convection. The heatsink 10 is configured to maximize the surface area in contact with a cooling medium (e.g., air) surrounding the heatsink. The heatsink 10 may be die cast or formed from any other suitable process and any suitable material (e.g., aluminum, copper, or other material) having relatively high heat conduction characteristics to allow heat transfer from electronic components mounted on the PCB 12 and optical modules inserted into the optical module cages 16 to the heatsink 10. The heatsink 10 may have any shape (e.g., height, width, length, ratio of width to length, footprint) and any number, size, or configuration of fins 15. The heatsink 10 is sized to fit over the PCB 12 and components mounted on the PCB, as shown in FIG. 1.

The fins 15 are positioned to allow air flow from the fans to pass between aligned rows of the fins (air flow in-line with fins). As described below, one or more fans are positioned on the chassis base for generating airflow across the fins 15 of the heatsink 10. The forced airflow over the fins 15 further increases cooling. As discussed below, the additional cooling provided by the heatsink 10 may reduce the need for operation of the fans (reduced speed or reduced operation time), thereby saving power and further reducing contamination of unsealed components (e.g., power supply or circuit components not located under the heatsink 10) by reducing the amount of air (with possible contaminants) passing through the chassis at a high velocity. For example, the fans may be stopped below a specified temperature within the chassis in which the heatsink 10 provides sufficient cooling. The fans may also operate at a reduced speed (revolution per minute (RPM)) based on cooling provided by the heatsink 10.

As described below, walls 30 of the heatsink 10 extend downward on three sides (rear and opposing sides) of the heatsink to mate with the seal (gasket) 18 on the base 14. An opening (U-shaped opening) 13 is defined along a front edge of the heatsink 10 to allow an upper surface of the heatsink to engage with components (optical module cages, ports, or other port assembly 16) mounted along a front edge of the PCB 12 and further enclose the sealed cavities (created by the heatsink walls 30 and seal 18 on the chassis base 14) to protect the PCB from corrosion. The front portion of the heatsink positioned over the port assemblies 13 may provide additional cooling to optical modules inserted into the optical module cage 16.

The printed circuit board assembly 12 may comprise any number of electronic components (circuits, chips, die, etc.). The printed circuit board 12 provides a dielectric material for copper or other conductive traces. The traces and pads are embedded within or deposited on the printed circuit board 12 for connection with the electronic components. Etching, deposition, bonding, or other processes may be used to form the traces, pads, or embedded components (e.g., passive or active devices). The printed circuit board may 12 include one or more active devices (e.g., transistor, chip, processor, circuit, application specific integrated circuit, field programmable gate array, memory, etc.) and one or more passive devices (e.g., capacitor, resistor, inductor, connector, via, pad, etc.). The traces, pads, and electronic components may be arranged in any configuration to perform any number of functions for operation on any type of network device (e.g., computer, router, switch, server, gateway, controller, edge device, access device, aggregation device, core node, intermediate node, or other network device). It is to be understood that the term 'printed circuit board' or 'printed circuit board assembly' as used herein refers to a substrate, circuits, and components mounted on the substrate.

The chassis base 14 includes a lower surface 21 and a rear wall 23 and side walls 25 extending upward from the lower surface. The side walls 25 include openings 17 to allow air to flow (e.g., airflow generated by fans) through the chassis. The side walls 25 may also include any number of openings 27 for receiving fasteners for attaching a chassis cover to the base 14. The lower surface 21 may also include openings 26 for receiving fasteners (e.g., screws) for attaching the heatsink 10 to the chassis base 14. As shown in FIG. 1, the PCB 12 may have recesses (notches) 19 formed along one or more edges to provide room for the fasteners.

Figure 2:
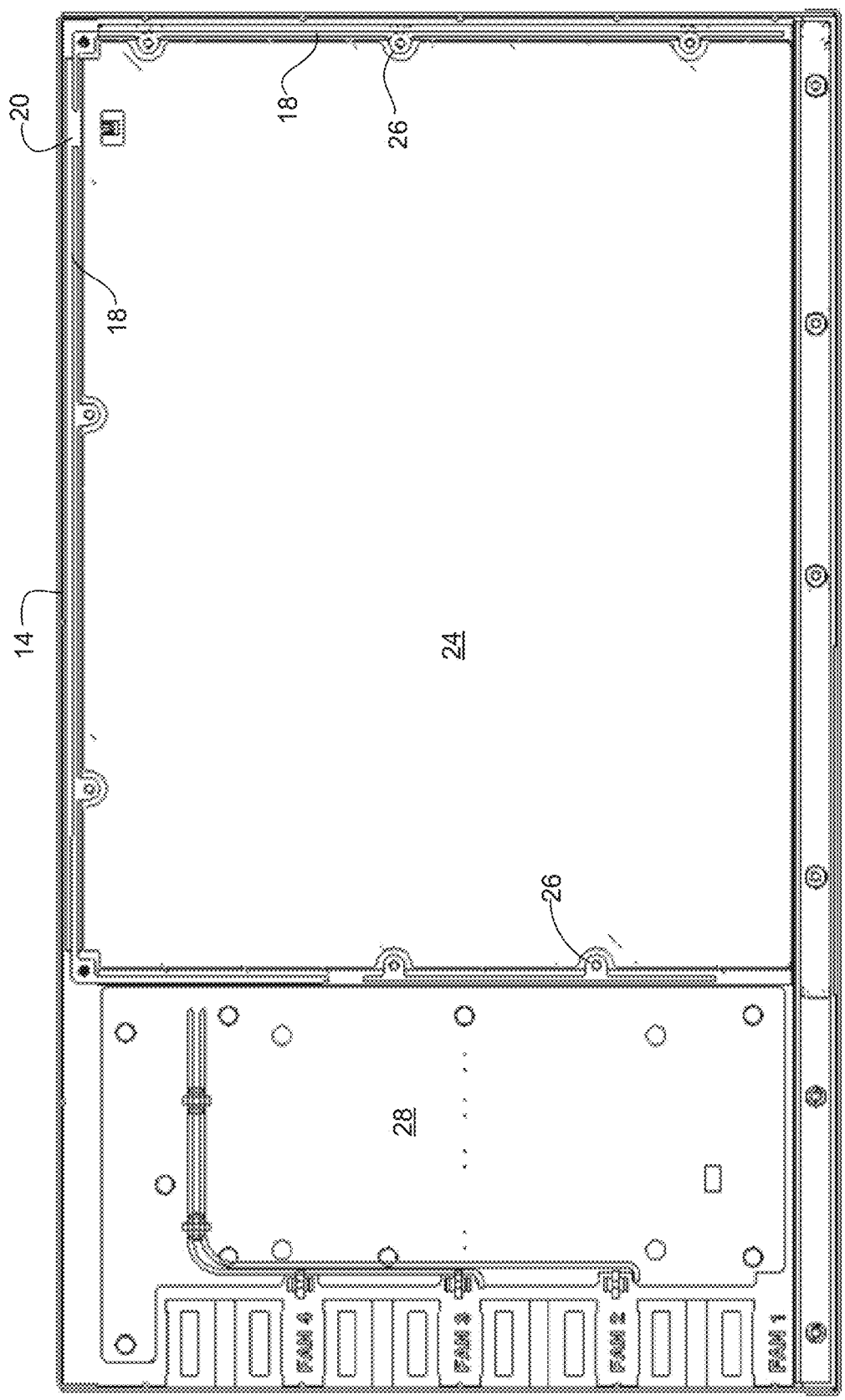
FIG. 2 is a top view of the chassis base with the printed circuit board and heatsink removed.

FIG. 2 is a top view of the chassis base 14 of FIG. 1 with the PCB 12 and heatsink 10 removed to show details. In the example shown in FIG. 2, the chassis base 14 comprises a plurality of grooves or channels 20 for receiving one or more seal (gasket) 18. The gasket 18 is positioned to seal the cavity under the heatsink 10 on the chassis base 14 where the PCB 12 sits, as described below with respect to FIGS. 4 and 5. The seal 18 is positioned to engage with a periphery edge of the heatsink 10 defined by walls 30 (FIG. 1) that mate with the chassis base 14. In the example shown in FIG. 2, the seal 18 comprises a U-shaped gasket comprising one or more sealing elements. As described above with respect to FIG. 1, port assemblies 16 are mounted on a front edge of the PCB 12, thus there is no seal positioned along the front edge of the chassis base 14. The port assemblies 16 and mating heatsink create a front enclosure for the PCB and components rearward of the port assemblies. Since forced airflow enters along a side edge of the heatsink, the seal created by the gasket 18 interposed between the side wall 30 of the heatsink and the chassis base 14 is important in preventing contaminants from entering the enclosure.

The PCB 12 is positioned on the chassis base 14 in a first portion of the base (indicted at 24) internal to the seal 18 (FIGS. 1 and 2). As described below with respect to FIGS. 6 and 7, one or more fans and power components (e.g., power supply units) are positioned in a second portion 28 of the base. The fans provide airflow across the heatsink 10 when additional cooling is needed.

Figure 3:
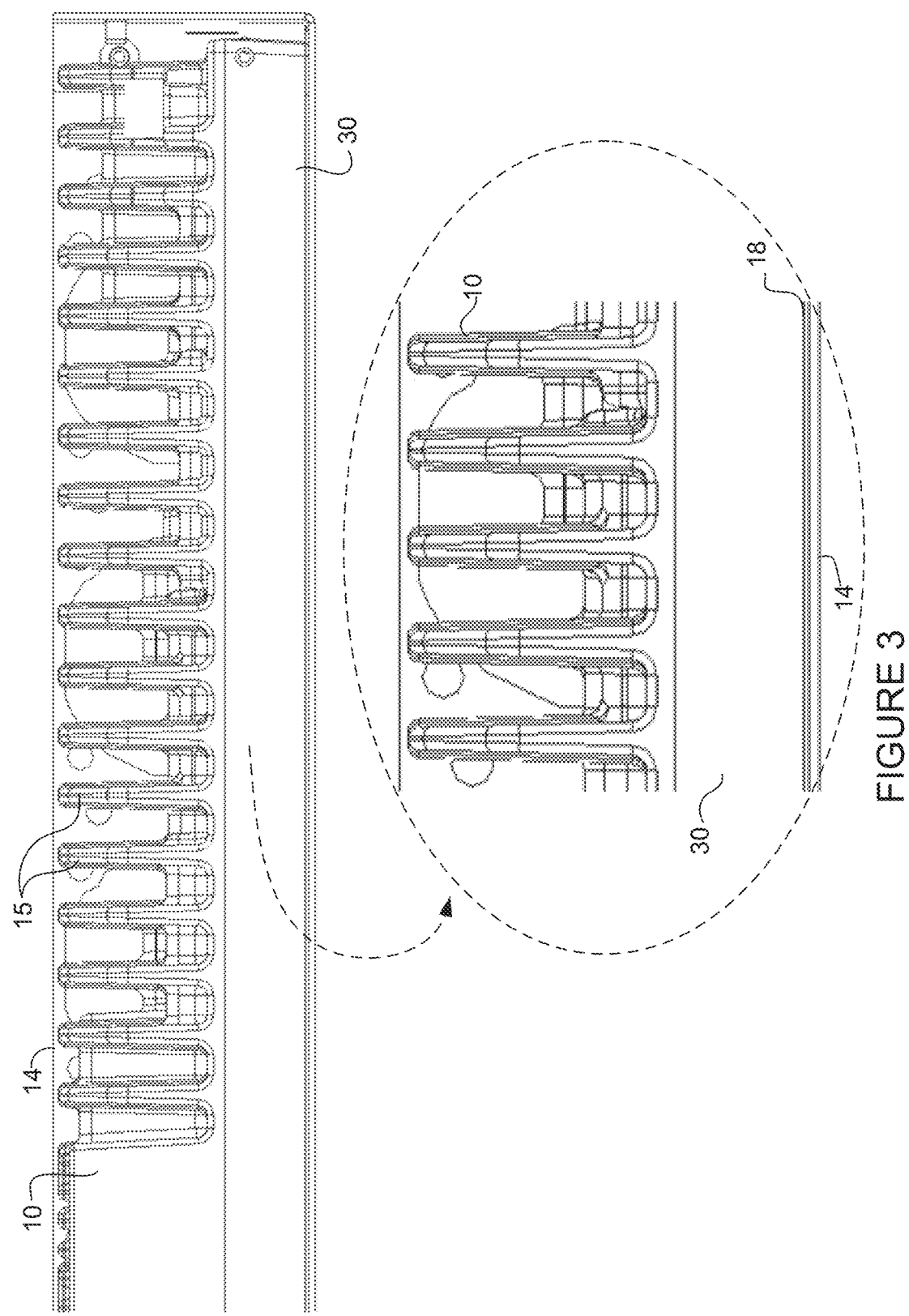
FIG. 3 is a side view of the heatsink installed over the printed circuit board on the chassis base.

FIG. 3 is a side view of the heatsink 10 installed on the chassis base 14. The heatsink 10 includes the fins 15 extending upward (as viewed in FIG. 3) and side walls 30 extending downward for engagement with the chassis base 14. An enlarged view in FIG. 3 illustrates an interface between the heatsink 10 and chassis base 14. As previously described with respect to FIGS. 1 and 2 a periphery seal (gasket) 18 is interposed between the heatsink wall 30 and chassis base 14.

Figure 4A:
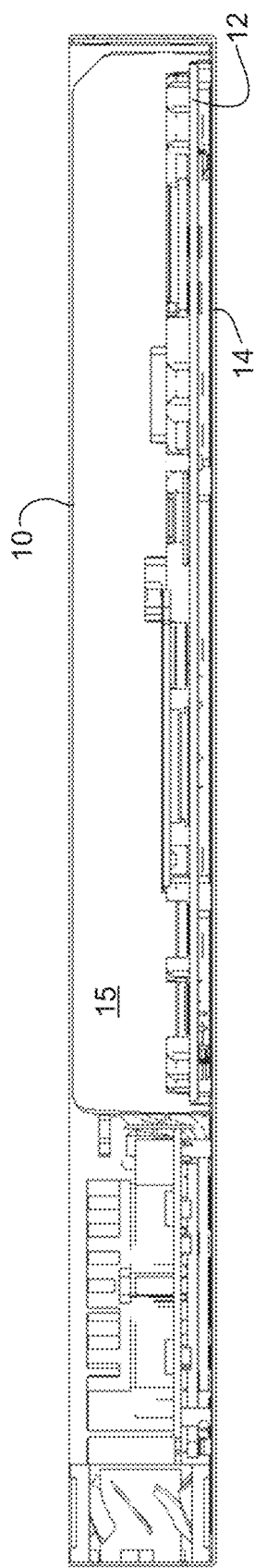
FIG. 4A is a cross-sectional front view of the heatsink installed over the printed circuit board on the chassis base.
Figure 4B:
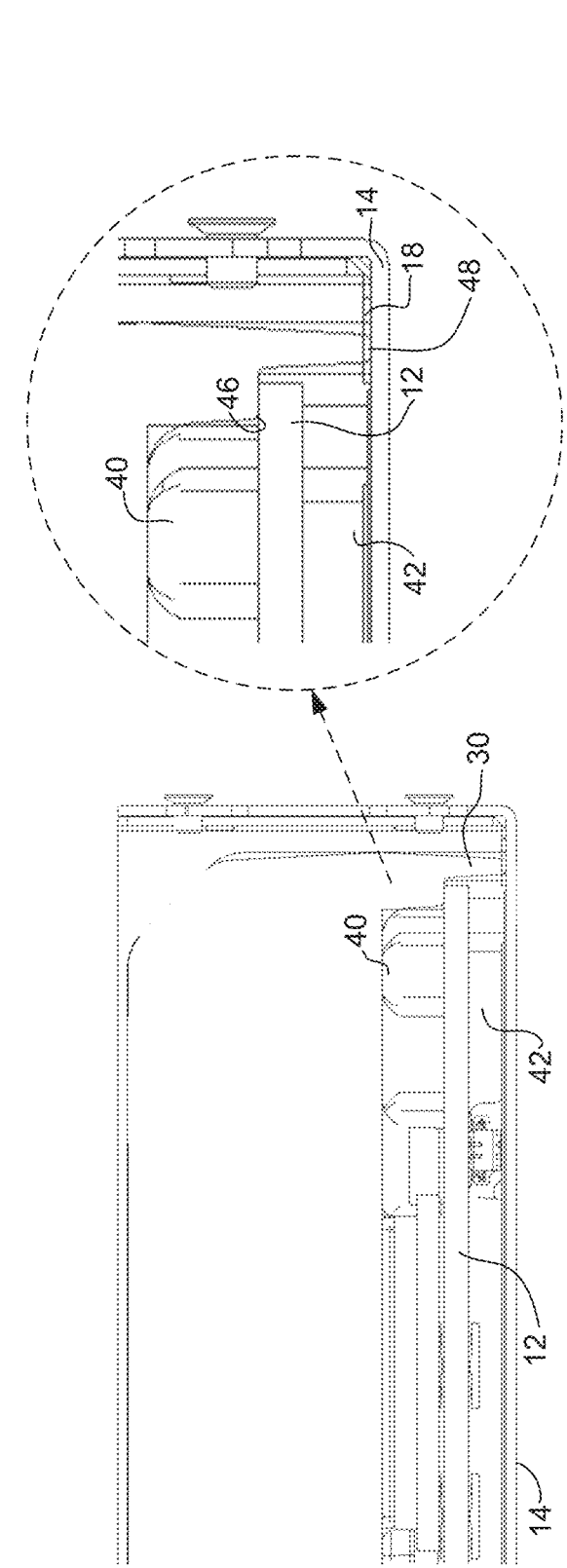
FIG. 4B shows is a cross-sectional front view showing an enlarged portion of the heatsink, printed circuit board, and chassis base shown in FIG. 4A.

FIGS. 4A and 4B illustrate a cross-sectional front view of the assembled heatsink 10, PCB 12, and chassis base 14. FIG. 4B shows an enlarged view of the cross-section shown in FIG. 4A. As previously described, the seal 18 is interposed between a lower edge 48 of wall 30 of the heatsink 10 and the chassis base 14. The heatsink 10 and the chassis base 14 define sealed cavities above the printed circuit board and below the printed circuit board. As shown in FIG. 4B, the heatsink 10 forms sealed cavity 40 on an upper surface of the PCB 12 and sealed cavity 42 on a lower surface of the PCB. An inner edge of the heatsink defines a continuous shoulder (shown at 46) that engages with an upper side (component side) of the printed circuit board 12 to provide additional sealing (also shown in FIG. 5).

Figure 5:
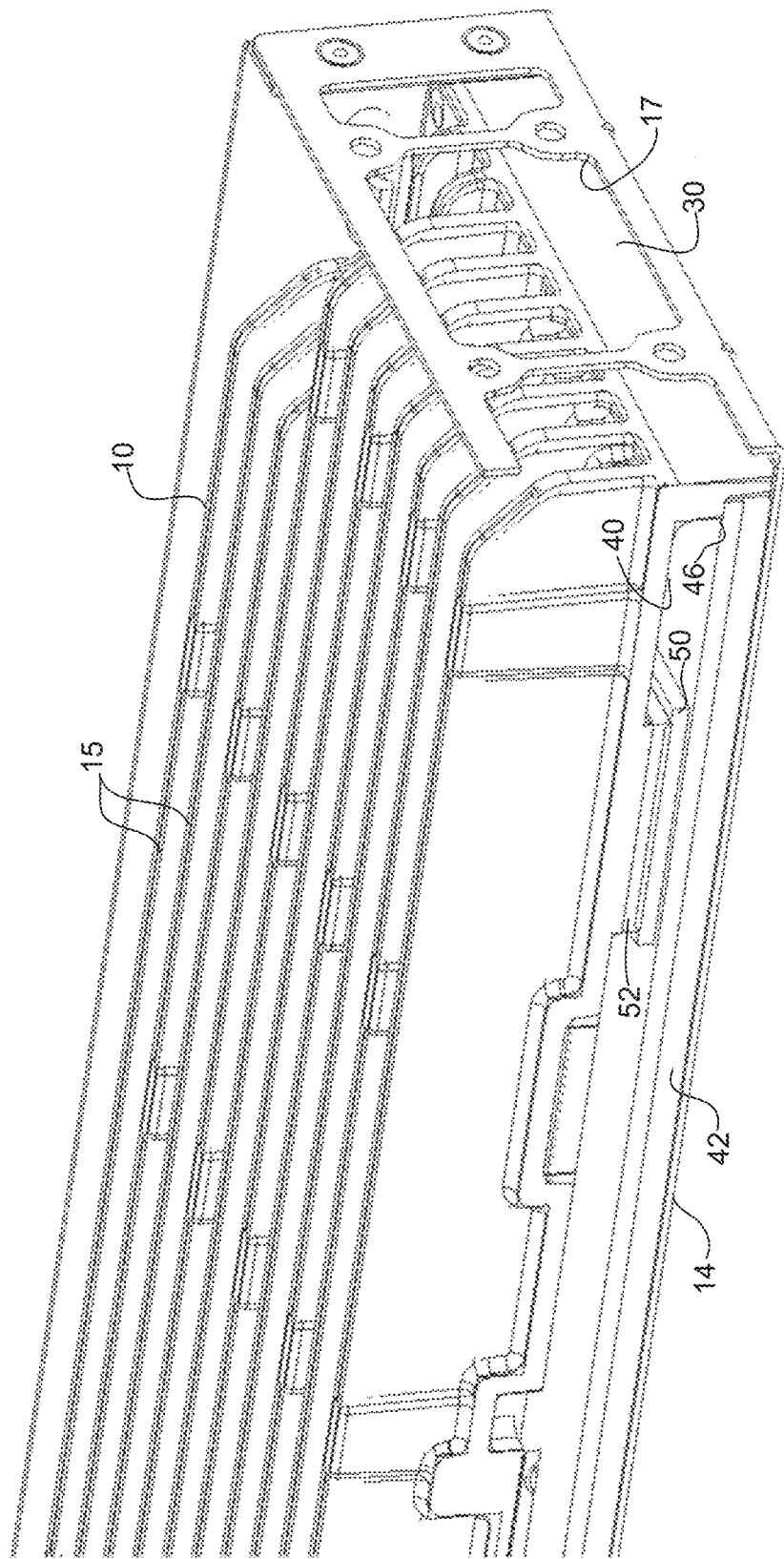
FIG. 5 is a cross-sectional perspective showing a portion of the heatsink, printed circuit board assembly, and chassis base.

FIG. 5 is a perspective cross-sectional view of the assembled heatsink 10, PCB 12, and chassis base 14 shown in FIG. 4A. Sealed cavity 40 defined by the heatsink 10 and the upper surface of the PCB 12 and sealed cavity 42 defined by the lower surface of the PCB and the chassis base 14 are shown in FIG. 5. As previously noted, any number or type of components (e.g., circuits, chips, die) may be mounted on the upper surface of the PCB 12. FIG. 5 shows an ASIC (Application Specific Integrated Circuit) 50 mounted on the PCB 12 and a high performance thermal gap pad 52 interposed between a lower surface of the heatsink 10 and the ASIC. In one example, the heatsink may 10 be configured for use with any number of thermal pads for providing direct contact between ASICs (or other components) and the heatsink for increased cooling of the ASICs.

Figure 6:
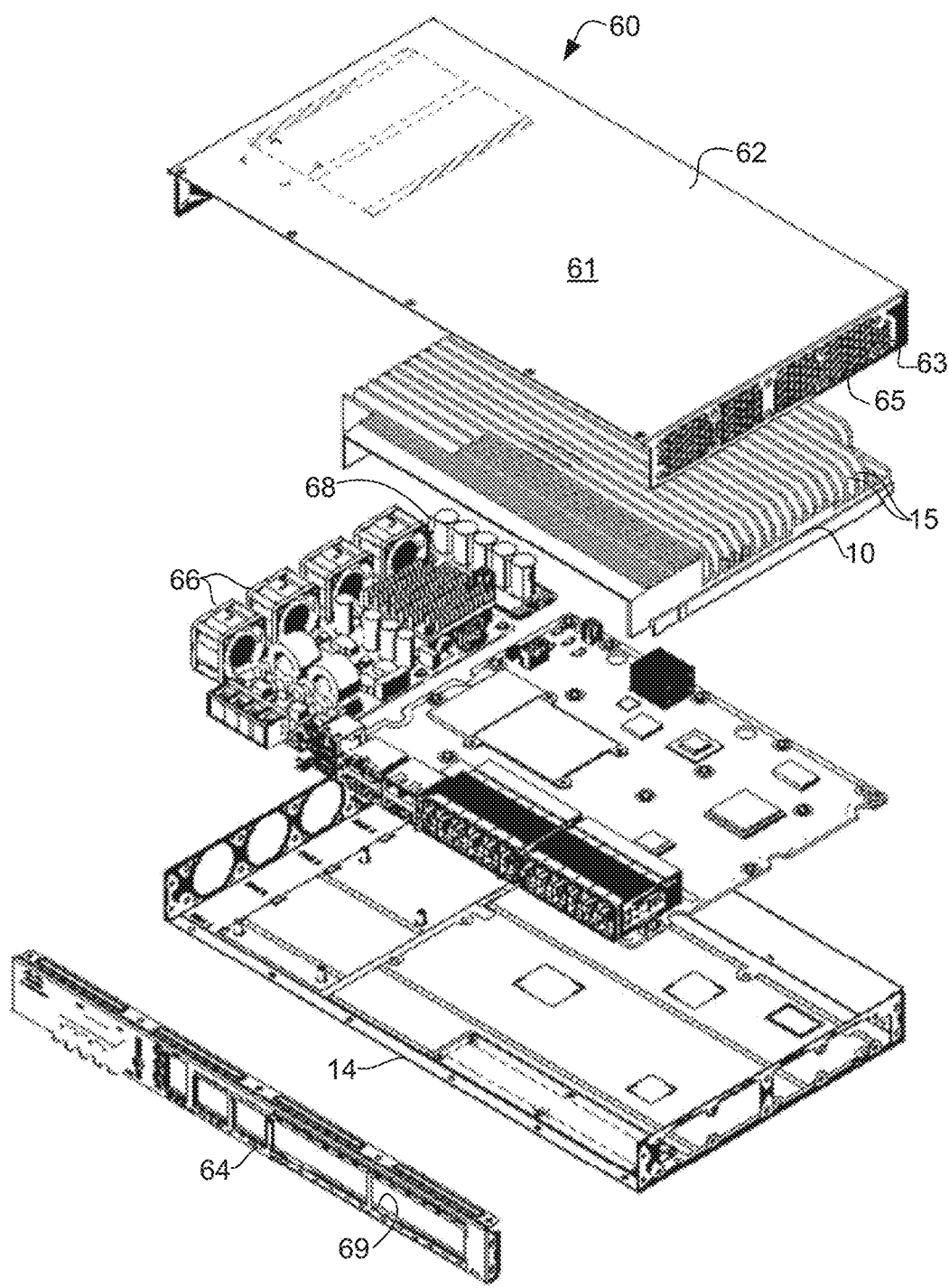
FIG. 6 is an exploded perspective of a chassis showing the heatsink and printed circuit board along with fans and power supplies.

FIG. 6 is an exploded view of a chassis 60, in accordance with one embodiment. The chassis may comprise, for example, a 1RU (Rack Unit) rack mounted chassis and may be configured for operation as a router, switch, or any other network device. The chassis includes the base 14, a cover 62, and a face plate 64. The face plate includes a number of openings for providing access to ports (receptacles, port assemblies) on the chassis 60. The cover 62 includes an upper surface 61 and walls 63 extending downward from the upper surface for alignment with walls 24 of the chassis base 14. The cover 62 may be fastened to the lower base 14 with any number of fasteners inserted into aligned openings in the cover and base. The side walls 63 of the cover 62 include openings 65 to allow airflow to pass therethrough. The chassis 60 further includes one or more fans (fan assemblies) 66 and power components (e.g., power supply units) 68. In one example, the fans 66 pull air through the chassis (air flow direction from right to left of chassis 60 as viewed in FIG. 6). As previously noted, the fins 15 of the heatsink 10 are aligned with the fans 66 such that airflow passes across the fins.

Figure 7:
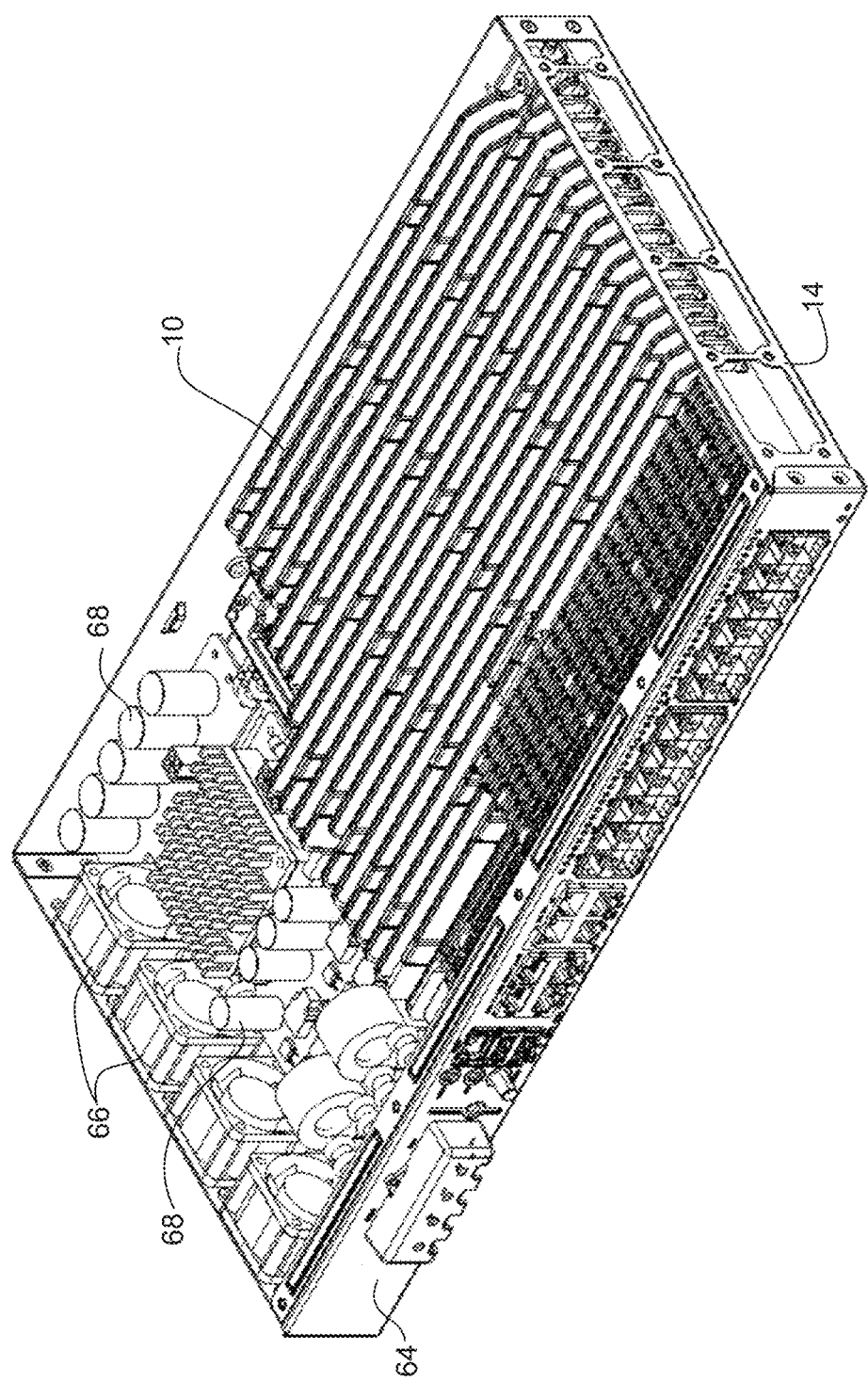
FIG. 7 is a perspective of the assembled chassis of FIG. 6 without the chassis cover.
Figure 8:
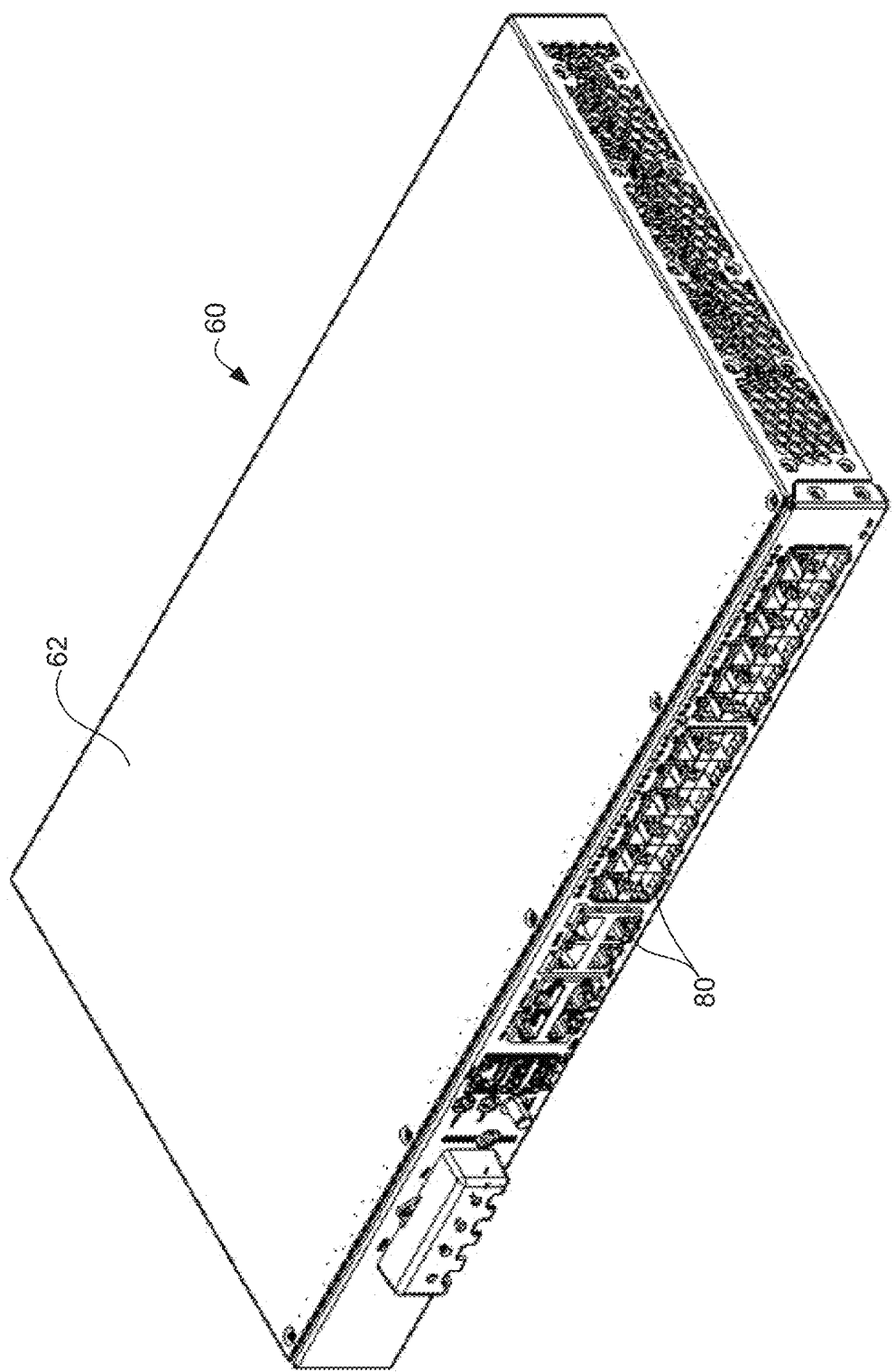
FIG. 8 is a perspective of the assembled chassis.

FIG. 7 is a perspective view of the assembled chassis with the cover 62 removed to show details of the heatsink 10, fans 66, and power supply units 68. FIG. 8 is a perspective of the chassis 60 with the cover 62 installed. As shown in FIG. 8, the assembled chassis 60 includes a plurality of ports 80 for receiving modules or plugs.

It is to be understood that the arrangement shown in FIGS. 1-7 is only an example and the sealing heatsink (corrosion preventive heatsink) 10 described herein may be used in other types of network devices (chassis) with different size or shape PCB (PCBA), or a different number, type, or arrangement of components (e.g., fans, power supply units, port assemblies, circuits, chips). Also, it is to be understood that the terms upper, lower, above, below, rear, front, back, and the like as used herein refer to the views shown in the drawings and may be different than described herein based on the position of the chassis.

In one or more examples, the equipment may be configured to be GR-3108 (Generic Requirements for Network Equipment in the Outside Plant) Class-3 compliant (and in some cases it may be worse than the standard due to customer installation requirements). In one or more embodiments, the equipment may be configured to operate up to 70° C. (300 m altitude) and include multiple fans to augment cooling at such temperatures, regardless of the cooling capacity of the corrosion preventive heatsink. Depending on the power dissipation of the printed circuit board assembly, fans may not be working up to a certain temperature or there may be up to 30° C. inlet temperature, for example, and the fans may turn at minimum speed for increased reliability. This also allows the fans to consume very low power (e.g., less than 2 watts).

In one example, the embodiments described herein operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data over one or more networks. The network devices may communicate over or be in communication with one or more networks, which may include any number or arrangement of network communications devices (e.g., switches, access points, routers, or other devices) operable to route (switch, forward) data communications. The embodiments described herein may be implemented, for example, in a rack mounted network device.

Figure 9:
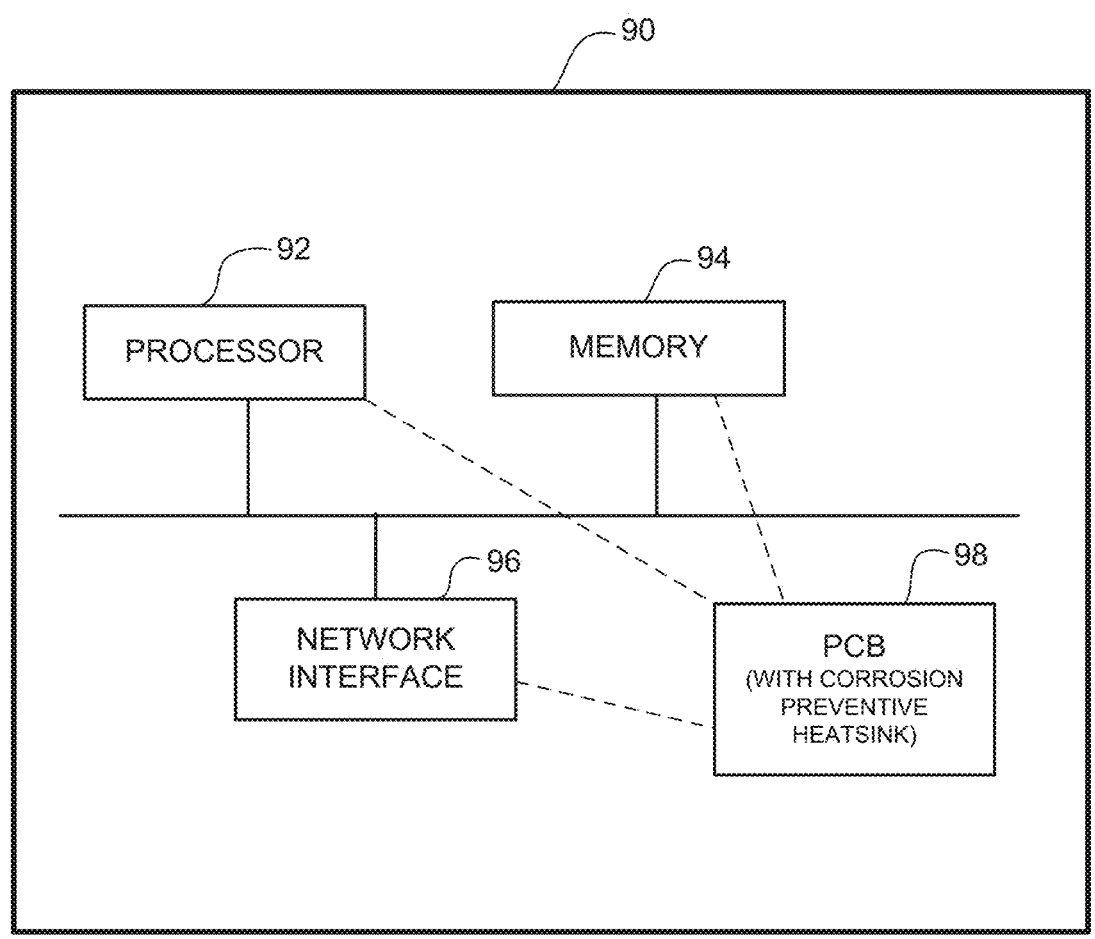
FIG. 9 is a block diagram depicting an example of a network device in which the embodiments described herein may be implemented.

FIG. 9 illustrates an example of a network device 90 (e.g., chassis 60) that may implement the embodiments described herein. In one or more embodiments, the network device 90 is a programmable machine that may be implemented in hardware, software, or any combination thereof. The network device 90 includes one or more processor 92, memory 94, network interface (port) 96. One or more of these components may be mounted on printed circuit board 98. As previously described, the printed circuit board and components are protected by the sealing heatsink (corrosion preventive heatsink). One or more of the processor 92, memory, 94, and network interfaces 96 may be mounted on the printed circuit board.

Memory 94 may be a volatile memory or non-volatile storage, which stores various applications, operating systems, modules, and data for execution and use by the processor. The network device may include any number of memory components (e.g., chips) 94 that may be protected from corrosion using the embodiments described herein.

Logic may be encoded in one or more tangible media for execution by the processor 92. For example, the processor 92 may execute codes stored in a computer-readable medium such as memory. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The network device 90 may include any number of processors. In one or more embodiments, logic may control operation (e.g., speed) of the cooling fans based on system temperature, for example. The PCB 98 may include any number of processors (e.g., circuits, chips, die) and may include a controller (e.g., software, code) operable to control fan speed based on measured operating temperature. As previously described, the corrosion preventive heatsink 10 may allow reduced speed or operation of the fans by providing increased cooling to the PCB.

The network interface may comprise any number of interfaces (line cards, ports, optical module cages) for receiving data or transmitting data to other devices.

It is to be understood that the network device shown in FIG. 9 and described above is only an example and that different configurations of network devices may be used. For example, the network device may further include any suitable combination of hardware, software, algorithms, processors, devices, components, or elements operable to facilitate the capabilities described herein. Also, it is to be understood that the embodiments described herein are not limited to use in a network device and may be used in any type of electronic equipment with components that are susceptible to corrosion.

As can be observed from the foregoing, the embodiments may be used to eliminate (or reduce) conformal coatings on a printed circuit board without increasing corrosion related failures in harsh environments, thereby saving costs on rework and initial manufacturing, while reducing service interruption. In one or more embodiments, manufacturing and product costs are reduced by eliminating (or reducing) conformal coatings, which allows the printed circuit board assemblies to be reworked. Overall system reliability may be increased due to increased MTBF (Mean Time Between Failure), allowing less service disruptions and improved user experience. Also, operating costs may be reduced by balancing natural and forced convection. For example, below a certain threshold temperature fans may not need to work, and above the threshold temperature fans may run at a lower speed (RPM) than conventional forced air cooling systems. By reducing or completely stopping one or more fans, accumulation of hygroscopic dust, which is one of the main contributors of corrosion, is minimized inside the chassis. Similarly, by reducing the amount of air passing through the unit, corrosion on non-sealed parts of the chassis due to contaminants, high humidity and possible high salt in the humid air in coastal regions in addition to hygroscopic dust is also reduced.

Although the method and apparatus have been described in accordance with the embodiments shown, one of ordinary skill in the art will readily recognize that there could be variations made without departing from the scope of the embodiments. Accordingly, it is intended that all matter contained in the above description and shown in the accompanying drawings shall be interpreted as illustrative and not in a limiting sense.

What is claimed is:

1. An apparatus comprising:
   a chassis comprising a plurality of upward extending walls;
   a printed circuit board mounted on the chassis;

a heatsink positioned over the printed circuit board to prevent corrosion of the printed circuit board, wherein the heatsink comprises a plurality of upward extending fins and a plurality of downward extending walls, and the plurality of downward extending walls are positioned interior of the plurality of upward extending walls of the chassis;

power components mounted on the chassis adjacent to the heatsink; and a seal interposed between an edge of the plurality of downward extending walls and the chassis, wherein the seal is positioned between the chassis and the printed circuit board.

2. The apparatus of claim 1, wherein the power components are offset from the printed circuit board.

3. The apparatus of claim 1, further comprising a port assembly positioned on the printed circuit board, wherein the heatsink engages with the port assembly.

4. The apparatus of claim 1, wherein an upward extending wall of the plurality of upward extending walls of the chassis comprises an opening that exposes the plurality of upward extending fins of the heatsink.

5. The apparatus of claim 4, further comprising a fan configured to direct air through the opening of the upward extending wall of the chassis and across the plurality of upward extending fins of the heatsink.

6. The apparatus of claim 1, wherein the plurality of downward extending walls of the heatsink engages with and extends past the printed circuit board.

7. The apparatus of claim 1, wherein the plurality of downward extending walls of the heatsink, the printed circuit board, and the chassis cooperatively define a sealed cavity extending between the printed circuit board and the chassis.

8. An apparatus comprising:
a chassis;
a printed circuit board mounted on the chassis;
a heatsink positioned over the printed circuit board, wherein the heatsink comprises a plurality of fins and a plurality of walls, wherein the heatsink at least partially defines a first cavity extending between the printed circuit board and the heatsink and a second cavity extending between the printed circuit board and the chassis, and each of the plurality of walls of the heatsink is exposed to the first cavity and the second cavity; and
a seal positioned between the chassis and the printed circuit board, wherein the seal extends at least partially into the second cavity, and each of the plurality of walls of the heatsink extends past the printed circuit board and engages with the seal.

9. The apparatus of claim 8, further comprising a fan configured to direct air across the plurality of fins of the heatsink.

10. The apparatus of claim 9, wherein the printed circuit board is configured to reduce operation of the fan based on a temperature within the chassis being below a threshold temperature.

11. The apparatus of claim 8, wherein the chassis comprises a plurality of side walls extending exterior of the plurality of walls of the heatsink.

12. The apparatus of claim 11, wherein each side wall of the plurality of side walls of the chassis extends beyond the printed circuit board.

13. An apparatus comprising:
a chassis;
a printed circuit board mounted on the chassis;
a seal positioned on the chassis; and
a heatsink positioned over the printed circuit board, wherein the heatsink comprises a plurality of fins and a plurality of walls, each of the plurality of walls comprises a first edge and a second edge, the first edge being engaged with a side of the printed circuit board facing away from the chassis, each of the plurality of walls extends past the printed circuit board such that the second edge is engaged with the seal, and each of the plurality of walls of the heatsink is exposed to a cavity extending between the printed circuit board and the chassis.

14. The apparatus of claim 13, wherein the second edge of each of the plurality of walls of the heatsink is positioned between the printed circuit board and the chassis.

15. The apparatus of claim 13, wherein each of the plurality of walls of the heatsink extends contiguously from the first edge engaged with the side of the printed circuit board to the second edge engaged with the seal.

16. The apparatus of claim 13, wherein the printed circuit board does not contact the seal.

17. The apparatus of claim 1, wherein the seal extends at least partially into a cavity extending between the printed circuit board and the chassis.

18. The apparatus of claim 1, wherein each of the plurality of downward extending walls of the heatsink extends past the printed circuit board and engages with the seal.

19. The apparatus of claim 8, wherein each of the plurality of walls of the heatsink faces the first cavity and the second cavity.

20. The apparatus of claim 13, wherein the seal is positioned between the chassis and the printed circuit board.

* * * * *